(12) United States Patent
Hyakudomi et al.

(10) Patent No.: US 11,099,236 B2
(45) Date of Patent: Aug. 24, 2021

(54) INSPECTION DEVICE AND CONTACT METHOD

(71) Applicant: TOKYO ELECTRON LIMITED, Tokyo (JP)

(72) Inventors: Takanori Hyakudomi, Yamanashi (JP); Masanori Ueda, Yamanashi (JP); Jun Fujihara, Yamanashi (JP); Kentaro Konishi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 69 days.

(21) Appl. No.: 16/491,535

(22) PCT Filed: Feb. 1, 2018

(86) PCT No.: PCT/JP2018/003384
§ 371 (c)(1),
(2) Date: Sep. 5, 2019

(87) PCT Pub. No.: WO2018/163675
PCT Pub. Date: Sep. 13, 2018

(65) Prior Publication Data
US 2020/0033404 A1 Jan. 30, 2020

(30) Foreign Application Priority Data
Mar. 7, 2017 (JP) .............................. JP2017-042559

(51) Int. Cl.
*G01R 31/28* (2006.01)
*G01R 1/073* (2006.01)

(52) U.S. Cl.
CPC ..... *G01R 31/2893* (2013.01); *G01R 1/07342* (2013.01); *G01R 31/2891* (2013.01)

(58) Field of Classification Search
CPC ............ G01R 31/2893; G01R 1/07342; G01R 31/2891; G01R 31/2831; G01R 31/2887
See application file for complete search history.

(56) References Cited

U.S. PATENT DOCUMENTS 9,638,745 B2    5/2017  Yamada
10,338,101 B2 * 7/2019  Tamura .............. G01R 31/2887
(Continued)

FOREIGN PATENT DOCUMENTS

JP    2009-204492 A    9/2009
JP    2013-254812 A    12/2013
(Continued)

OTHER PUBLICATIONS

PCT International Search Report and Written Opinion, PCT Application No. PCT/JP2018/003384, dated Apr. 24, 2018, 7 pages (with English translation of International Search Report).

*Primary Examiner* — Akm Zakaria
(74) *Attorney, Agent, or Firm* — Fenwick & West LLP (57) ABSTRACT

An inspection device includes a chuck top that holds a wafer, a probe card disposed to face the wafer held by the chuck top and having a plurality of contact probes on a surface facing the wafer, a pogo frame that holds the probe card, a bellows that surrounds the probe card and the contact probes and forms a sealed space when the wafer is close to or in contact with the contact probes, a gas exhaust path configured to depressurize the pressure in the sealed space, and a mechanical stopper that is provided between the pogo frame and the chuck top and restricts the vertical inclination of the chuck top when a predetermined contact is made between the wafer and the contact probes.

18 Claims, 11 Drawing Sheets

(56) References Cited

U.S. PATENT DOCUMENTS

2008/0196474 A1* 8/2008 Di Stefano ........ G01R 31/2891
73/1.01
2018/0252765 A1* 9/2018 Nagashima ........ G01R 31/2887

FOREIGN PATENT DOCUMENTS

WO    WO 2014/054377 A1    4/2014
WO    WO 2016/159156 A1    10/2016

* cited by examiner

(PRIOR ART)

FIG.14B

(PRIOR ART)

(PRIOR ART)

INSPECTION DEVICE AND CONTACT METHOD

TECHNICAL FIELD

The present invention relates to an inspection device for inspecting electrical characteristics of a target object, and a contact method.

BACKGROUND

In a semiconductor device manufacturing process, electrical inspection of semiconductor devices (hereinafter, simply referred to as "devices") formed on a semiconductor wafer (hereinafter, simply referred to as "wafer") is performed after all processes are finished on the wafer. A prober is used as an inspection device for performing such inspection. The prober includes a probe card facing the wafer. The probe card has a plate-shaped base and contact probes (probe needles) that are multiple columnar contact terminals arranged at the base to face electrodes of the devices on the wafer (see, e.g., Patent Document 1).

In the prober, the contact probes of the probe card are brought into contact with the electrodes (including electrode pads and solder bumps) of the devices by pressing the wafer against the probe card using a stage for attracting and holding the wafer, and electricity is made to flow from the contact probes to electric circuits of the devices connected to the electrodes to inspect electrical characteristics such as conducting states of the electric circuits and the like.

As an example of the prober (inspection device) described above, there is known one having a structure in which the electrodes of the devices formed on the wafer are brought into contact with the contact probes of the probe card by depressurizing a space between the chuck for attracting and holding the wafer and the probe card (see, e.g., Patent Document 2).

Figure 14A:
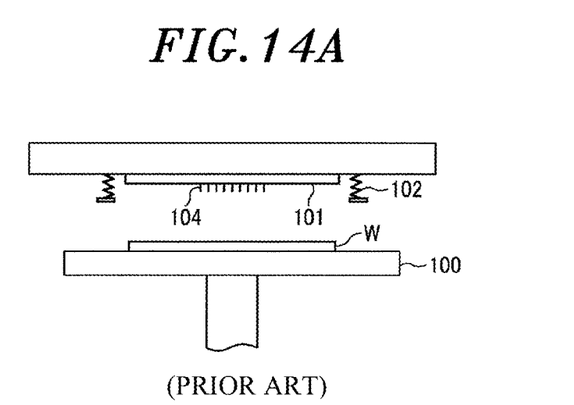
FIGS. 14A to 14C explain operations in the conventional inspection device.
Figure 14B:
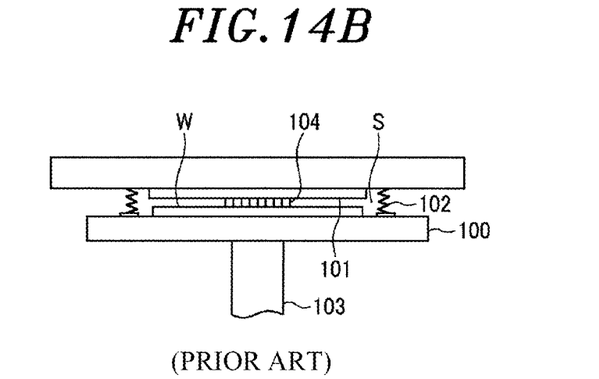
Figure 14C:
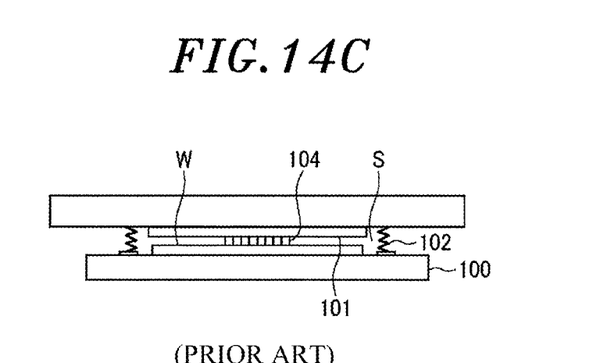

In the inspection device disclosed in Patent Document 2, as shown in FIG. 14A, the wafer W is mounted, attracted, and held on a chuck top 100 and an expandable/contractible cylindrical-shaped bellows 102 is disposed to surround a space between the chuck top 100 and a probe card 101 to form a sealed space S. Then, as shown in FIG. 14B, the sealed space S is depressurized and contracted to attract the wafer W and the chuck top 100 to the probe card 101. Accordingly, the wafer W is brought into contact with contact probes 104 of the probe card 101. Then, the wafer W is further raised by a predetermined overdrive amount. The chuck top 100 is supported by an aligner 103 until the wafer W is in contact with the probe card 101. After the wafer W is in contact with the probe card 101, the aligner 103 is separated from the chuck top 100 as shown in FIG. 14C.

PRIOR ART

Patent Document 1: Japanese Patent Application Publication No. 2009-204492
Patent Document 2: Japanese Patent Application Publication No. 2013-254812

Figure 15:
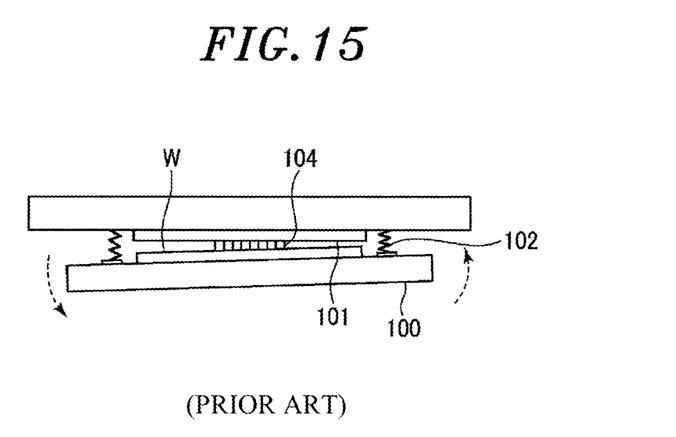
FIG. 15 shows a state in which an attracted chuck top is inclined in the conventional inspection device.

In general, the wafer W is mounted on the chuck top 100 such that the center of the wafer W coincides with the center of the chuck top 100, and the center of the probe card 101 is made to coincide with the center of the wafer W. However, when multiple devices to be inspected on the wafer W are disposed at positions offset from the center of the wafer W, the center of gravity of the contact probes 104, i.e., a resultant force of reaction forces from the contact probes 104, is applied to the positions offset from the center of the chuck top 100. Accordingly, a moment is generated on the chuck top 100. At this time, the moment of the chuck top 100 is canceled by the aligner 103 while the aligner 103 is holding the chuck top 100. However, when the aligner 103 is separated from the chuck top 100, the chuck top 100 is vertically inclined due to the moment generated on the chuck top 100 as shown in FIG. 15 and parallism between the wafer and the probe card (or parallel state of the wafer with respect to the probe card) deteriorates.

As a result, parts of the contact probes 104 are excessively overdriven. In the case of the excessively overdriven contact probes 104, a spring constant decreases quickly (lifetime is shortened due to a decrease in durability). When the spring constant decreases, the overdrive amount increases even under the same depressurization setting. Therefore, scrub marks or needle traces of the contact probes 104 become long and the contact probes will penetrate the pad surface deeper and will leave a snowplow type scrub mark. Accordingly, it is difficult to make desirable contact between the contact probes 104 and the electrode pads of the devices, and the inspection may not be properly performed.

Therefore, the present invention provides an inspection device capable of performing proper inspection while suppressing excessive overdrive of contact probes, and a contact method.

SUMMARY

In accordance with a first aspect of the present invention, there is provided an inspection device for bringing multiple contact probes into contact with a substrate in a depressurized state to inspect electrical characteristics of devices formed on the substrate, the inspection device comprising: a substrate holding member configured to hold the substrate; a probe card disposed to face the substrate held by the substrate holding member and having the contact probes on a surface facing the substrate; a support member configured to support a surface of the probe card which is opposite to a surface facing the substrate; a bellows that surrounds the probe card and the contact probes and forms a sealed space together with the support member and the substrate holding member when the substrate is close to or in contact with the contact probes; a gas exhaust path for depressuring the sealed space to form a depressurized space; and an inclination restriction mechanism disposed between the support member and the substrate holding member and configured to restrict vertical inclination of the substrate holding member when predetermined contact is made between the substrate and the contact probes.

The inclination restriction mechanism may include mechanical stoppers disposed around the bellows. Further, each of the mechanical stoppers may have a rod that is vertically movable by vertical movement of the substrate holding member, with one end of the rod being positioned on the substrate holding member and the other end being free, and a lock mechanism configured to lock upward movement of the rod when predetermined contact is made between the substrate and the contact probes, and the mechanical stoppers may include three or more mechanical stoppers disposed around the bellows.

After the substrate is retained by the substrate holding member, the substrate holding member may be raised to form the sealed space.

Further, the inspection device may further comprise a pressing force application unit disposed around the bellows and configured to apply a pressing force that presses the substrate holding member downward. The pressing force application unit may have multiple auxiliary bellows which have airtight spaces therein and are disposed around the bellows, and may apply the pressing force that presses the substrate holding member downward by pressurizing the airtight spaces by a gas supplied into the airtight spaces.

In accordance with a second aspect of the present invention, there is provided a contact method for bringing multiple contact probes into contact with a substrate in a depressurized state using an inspection device including a substrate holding member configured to hold the substrate and a probe card having the contact probes on a surface facing the substrate, the contact method comprising: transferring the substrate to the substrate holding member below the probe card and adjusting a position of the substrate holding member using an aligner such that the substrate is disposed to face the probe card; raising the substrate holding member using the aligner to a position where the substrate is close to or in contact with the contact probes and forming a sealed space in a region including the probe card, the contact probes, and the substrate using a bellows; raising the substrate holding member using the aligner to a position where predetermined contact is made between the substrate and the contact probes in a state where the sealed space is formed; depressurizing the sealed space; restricting inclination of the substrate holding member using an inclination restriction mechanism; and retracting the aligner from the substrate holding member.

According to the second aspect of the present invention, the inclination restriction mechanism may have mechanical stoppers disposed around the bellows. In such a case, each of the mechanical stoppers may have a rod that is vertically movable by vertical movement of the substrate hold member, with one end of the rod being positioned against the substrate holding member and the other end being free, and a lock mechanism configured to lock upward movement of the rod when predetermined contact is made between the contact probes and electrodes of devices formed on the substrate. The mechanical stoppers may include three or more mechanical stoppers disposed around the bellows, and the rod may be raised in an unlocked state by the substrate holding member before the step of restricting the inclination, and upward movement of the rod is locked by the lock mechanism during the step of restricting the inclination.

Further, the step of restricting the inclination may be performed after the step of depressurizing the sealed space. The contact method may further comprise, after the step of restricting the inclination, adjusting a pressure in the sealed space to a level at which the substrate holding member is held.

The position where the predetermined contact is made between the substrate and the contact probes may be a position where the contact probes are overdriven by a predetermined amount after the substrate and the contact probes are in contact with each other.

When the substrate holding member is lowered after the predetermined contact is made between the substrate and the contact probes, a pressing force that presses the substrate holding member downward may be applied by a pressing force application unit. In such a case, the pressing force application unit may have multiple auxiliary bellows which have airtight spaces therein and are disposed around the bellows, and may apply the pressing force that presses the substrate holding member downward by pressurizing the airtight space by a gas supplied into the airtight space.

According to the aspects of the present invention, after a predetermined contact is formed between the substrate and the contact probes, an inclination of the substrate holding member is regulated by the inclination restriction mechanism. Therefore, when a test is performed in a state where the substrate holding member is sucked upward by depressurizing a space including the substrate and the contact probes, an inclination of the substrate holding member due to offset of the center of gravity of the probe can be prevented and excessive overdrive of the contact probes can be suppressed. Accordingly, an appropriate test can be carried out.

DETAILED DESCRIPTION

Hereinafter, embodiments of the present invention will be described with reference to the accompanying drawings.

<Inspection Device>

First, an example of an overall configuration of an inspection system including an inspection device according to a first embodiment of the present invention will be described.

Figure 1:
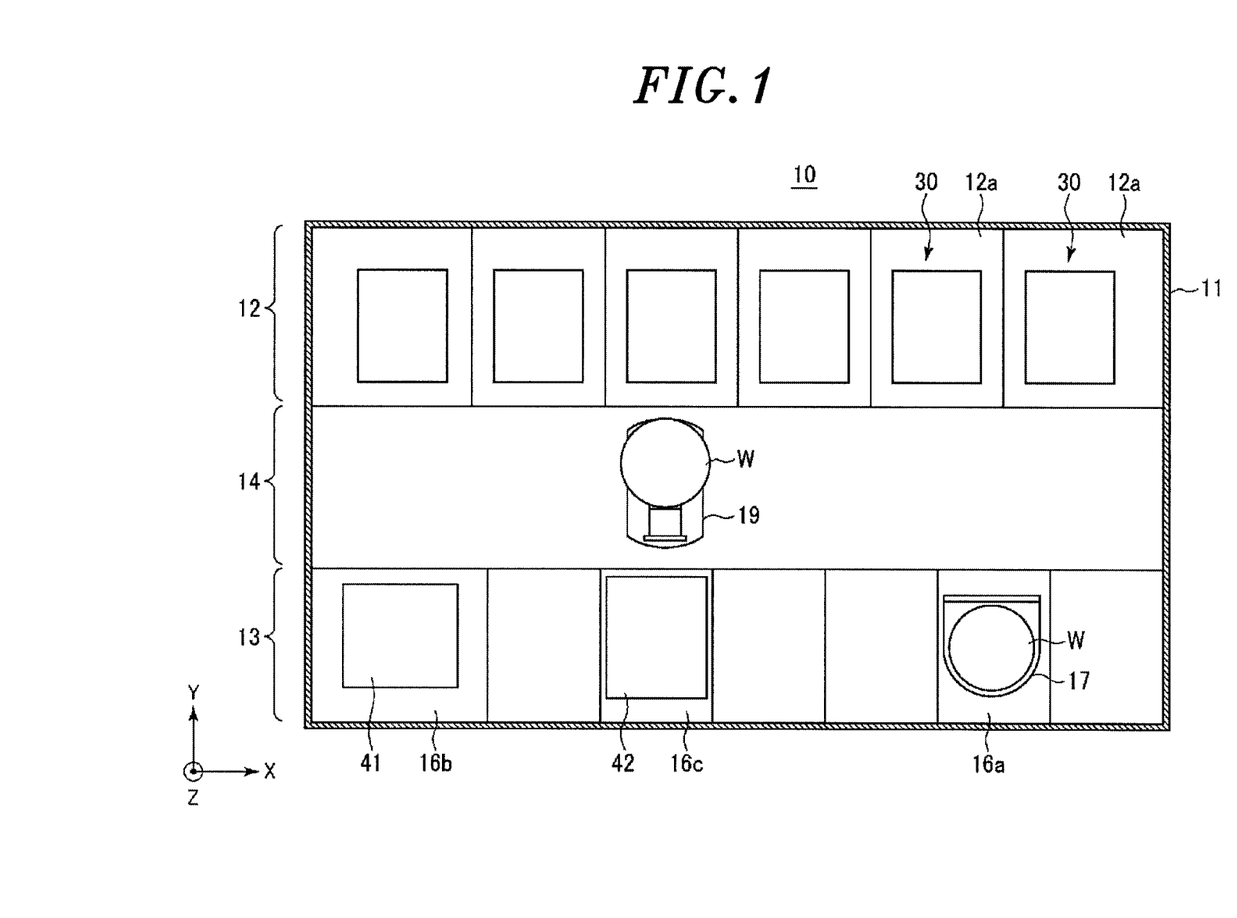
FIG. 1 is a horizontal cross-sectional view schematically showing an exemplary configuration of an inspection device.
Figure 2:
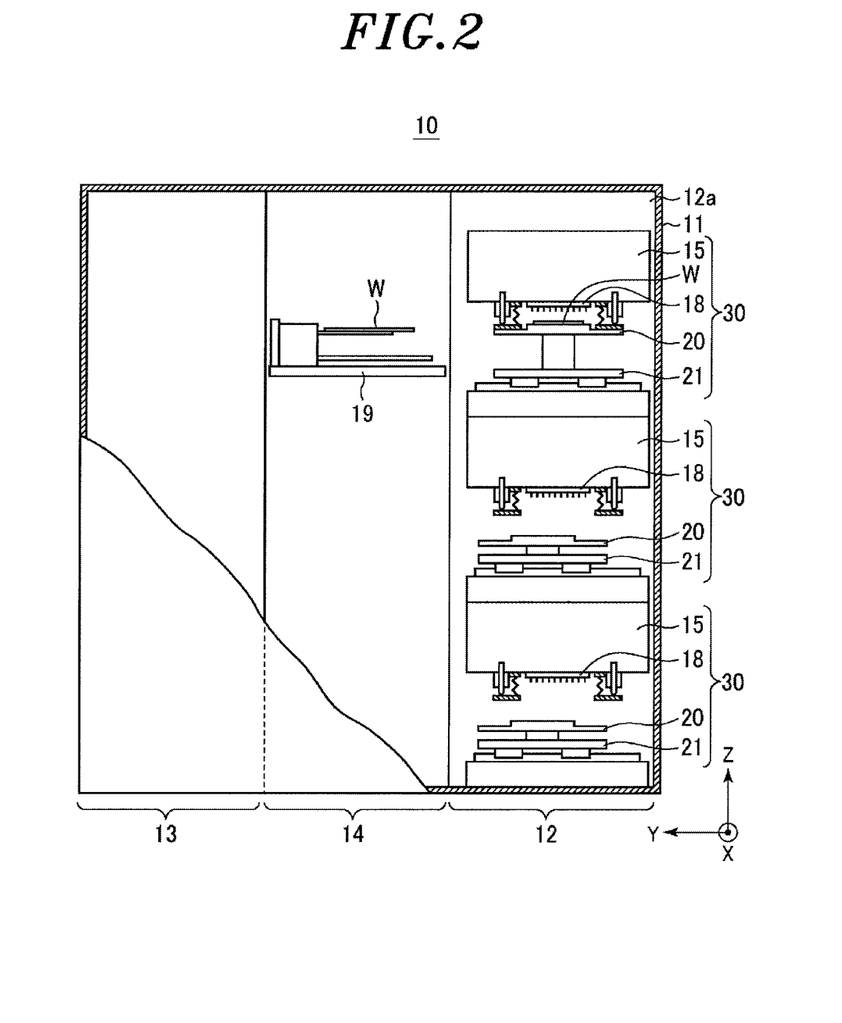
FIG. 2 is a vertical cross-sectional view of the inspection device shown in FIG. 1.

FIG. 1 is a horizontal cross-sectional view schematically showing the exemplary configuration of the inspection system. FIG. 2 is a vertical cross-sectional view of the inspection system of FIG. 1.

In FIGS. 1 and 2, an inspection system 10 includes a housing 11. An inner space of the housing 11 includes an inspection area 12 for inspecting electrical characteristics of semiconductor devices of a wafer W, a loading/unloading area 13 for loading/unloading the wafer W, and a transfer area 14 disposed between the inspection area 12 and the transfer area 13.

The inspection area 12 has therein a plurality of (six in this example) inspection chambers 12a arranged along the X-direction. The inspection device 30 of the present embodiment is arranged at multiple stages (three stages in FIG. 2) in each inspection chamber 12a. Each inspection device 30 has an upper structure 15 including a tester as an interface for inspection, and a disc-shaped probe card 18 is attached to a bottom portion of the upper structure 15. In each inspection device 30, a chuck top 20 that is a disc-shaped member on which the wafer W is mounted and attracted is disposed to correspond to the probe card 18 attached to the upper structure 15. The chuck top 20 is supported by an elevating member 21a of an aligner 21, and is moved vertically and horizontally (in XYZ directions) by the aligner 21. Therefore, the wafer W mounted on the chuck top 20 is positioned to face the probe card 18. The aligner 21 is shared by six inspection devices 30 on the same stage, and is movable along the X direction.

The loading/unloading area 13 is divided into multiple ports including a wafer loading/unloading port 16a accommodating, e.g., a FOUP 17 as a container accommodating a plurality of wafers W, a loader port 16b accommodating a loader 41 into/from which the probe card 18 is loaded/unloaded, and a control unit accommodation port 16c accommodating a control unit 42 for controlling operations of each components of the inspection system 10.

A movable transfer robot 19 is disposed in the transfer area 14. The transfer robot 19 transfers the wafer W from the wafer loading/unloading port 16a of the loading/unloading area 13 and to the chuck top 20 of each inspection device 30, and transfers the wafer W having devices of which electrical characteristics have been inspected from the chuck top 20 of the corresponding inspection device 30 to the wafer loading/unloading port 16a. Further, the transfer robot 19 transfers the probe card 18 requiring maintenance from each inspection device 30 to the loader 41 of the loader port 16b, and transfers a new probe card 18 or the probe card 18 whose maintenance has been completed from the loader 41 of the loader port 16b to each inspection device 30.

The control unit 42 includes a main controller having a CPU (computer) for controlling the respective components of the inspection system 10, e.g., the respective parts of the inspection device 30, the transfer robot 19, the aligner 21, and the like; an input device (a keyboard, a mouse or the like); an output device (a printer or the like); a display device (a display or the like); and a storage device (a storage medium). The main controller of the control unit 42 causes the inspection system 10 to execute a predetermined operation based on a processing recipe stored in a storage medium built in the storage device or a storage medium set in the storage device.

First Embodiment of the Inspection Device

Hereinafter, the inspection device 30 according to a first embodiment will be described in detail.

Figure 3:
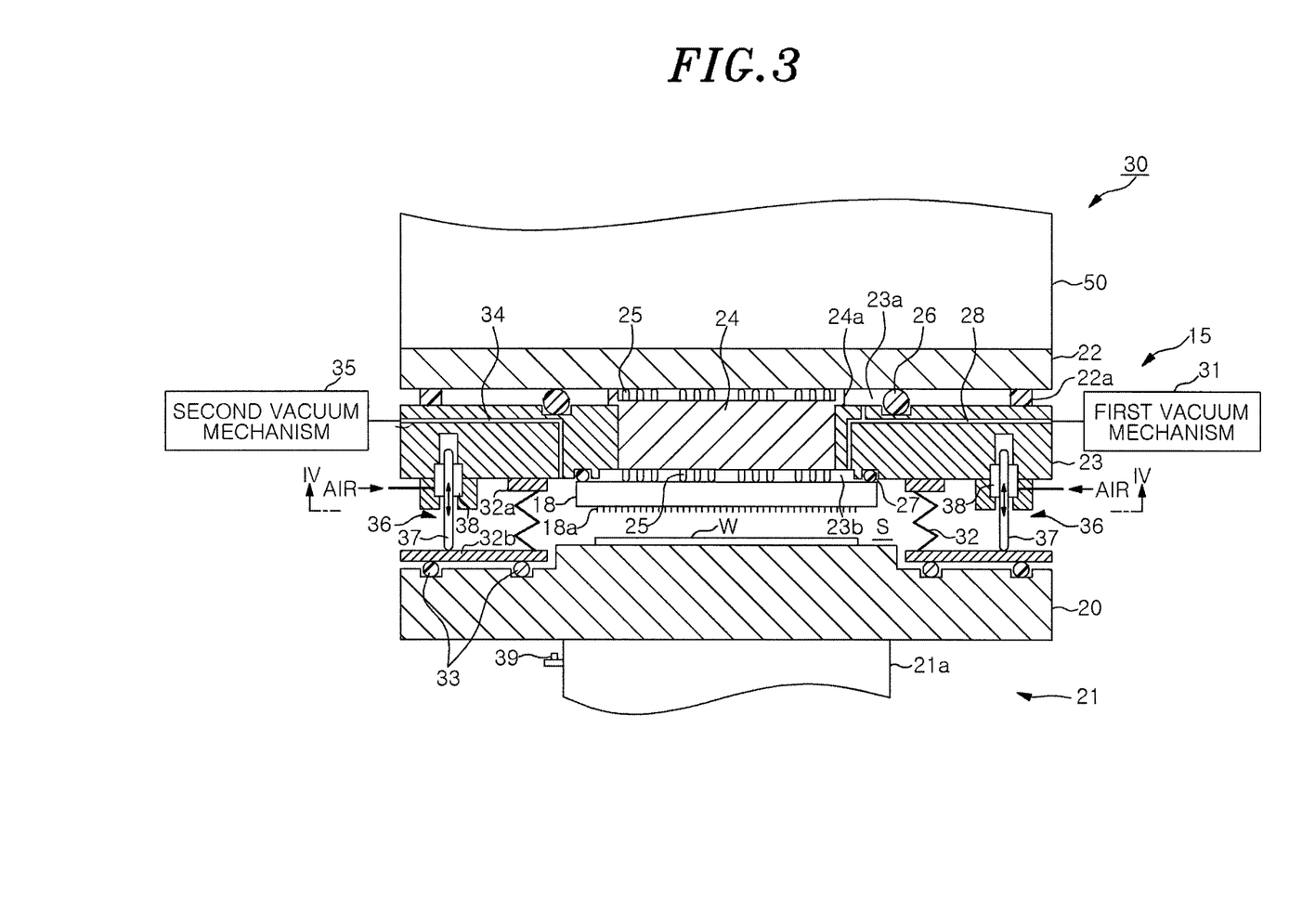
FIG. 3 is a cross-sectional view showing an inspection device according to a first embodiment.
Figure 4:
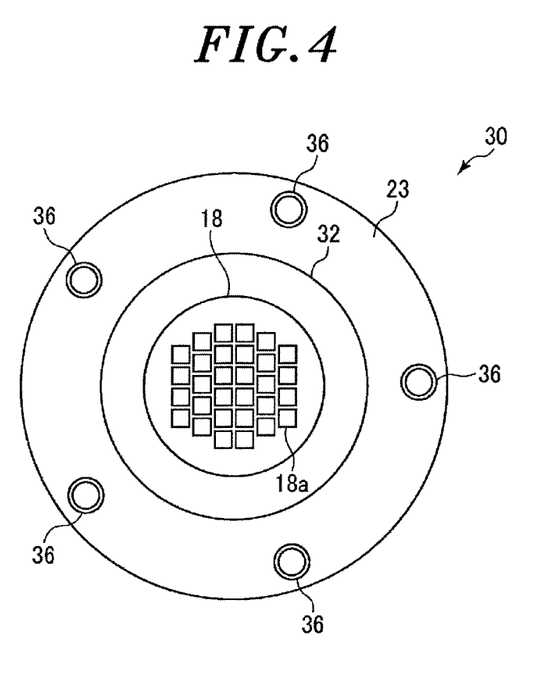
FIG. 4 is a cross-sectional view taken along a line IV-IV in FIG. 3.

FIG. 3 is a cross-sectional view showing the inspection device 30. FIG. 4 is a cross-sectional view taken along a line IV-IV of FIG. 3.

As shown in FIG. 3, the inspection device 30 integrally incorporates a tester 50. The tester 50 includes a motherboard 22 disposed at a lower end portion thereof, and multiple inspection circuit boards (not shown) fitted upright to the motherboard 22.

An annular thick plate-shaped pogo frame 23 is disposed below the motherboard 22. A probe card 18 is attached to a bottom portion of the pogo frame 23. In other words, the pogo frame 23 serves as a support member for supporting the probe card 18. A pogo block 24 is disposed at a central portion of the pogo frame 23. A plurality of pogo pins 25 for electrically connecting the probe card 18 and the motherboard 22 is formed on the upper surface and the bottom surface of the pogo block 24. The tester 50 including the motherboard 22, the pogo frame 23, and the pogo block 24 constitute the upper structure 15.

A flange 24a is formed at an upper portion of the pogo block 24. The flange 24a is engaged with the upper surface of the pogo frame 23. An annular seal member 26 closely contacting with the bottom surface of the motherboard 22 is disposed on the upper surface of the pogo frame 23. An annular seal member 27 closely contacting with the probe card 18 is disposed on the bottom surface of the pogo frame 23. A spacer 22a is disposed at an outer peripheral portion between the motherboard 22 and the pogo frame 23.

The pogo frame 23 has therein a gas exhaust path 28 having one end connected to a line extending from a first vacuum mechanism 31 including a vacuum pump and the other end branched into one connected to a space 23a surrounded by the seal member 26 between the motherboard 22 and the pogo frame 23 and the other end connected to a space 23b surrounded by the seal member 27 between the pogo frame 23 and the probe card. By the vacuum suction of the first vacuum mechanism 31, the spaces 23a and 23b are depressurized. Accordingly, the pogo frame 23 is vacuum-attracted via the seal member 26, and the probe card 18 is vacuum-attracted via the seal member 27.

The probe card 18 has on a bottom surface thereof multiple contact probes 18a to be in contact with the electrodes of the devices formed on the wafer W.

The chuck top 20 is disposed below the probe card 18 to face the probe card 18, and the wafer W is attracted and held on the chuck top 20. As described above, the chuck top 20 is supported by the elevating member 21a of the aligner 21, and is movable vertically and horizontally (in XYZ directions) by the aligner 21. Accordingly, the wafer W mounted on the chuck top 20 is positioned to face the probe card 18.

A height sensor 39 is disposed at the elevating member 21a of the aligner 21 to face the chuck top 20. The height sensor 39 measures a distance (height) between the elevating member 21a and the chuck top 20. After the elevating member 21a reaches the chuck top 20, the moving distance of the elevating member 21a is measured using an encoder of a motor for driving the elevating member 21a.

A cylindrical bellows 32 suspended toward the chuck top 20 is disposed on the bottom surface of the pogo frame 23 to surround the probe card 18 and the contact probes 18a. The bellows 32 is extensible in the vertical direction. The upper end of the bellows 32 is attached to the bottom surface of the pogo frame 23 via an annular upper support member 32a. A gap between the upper support member 32a and the pogo frame 23 is airtightly sealed. An annular lower support member 32b is attached to the lower end of the bellows 32. Two ring-shaped seal members 33 are disposed on the upper surface of the chuck top 20 to correspond to the lower support members 32b. When the chuck top 20 is raised by the aligner 21 and brought into contact with the seal members 33, a sealed space S is formed in a region including the wafer W and the contact probes 18a, with the region being defined by the bellows 32, the pogo frame 23 and the chuck top 20. As the seal member 33, a lip seal having a high sealing property may be used.

The pogo frame 23 has therein a gas exhaust path 34 having one end connected to a line extending from a second vacuum mechanism 35 including a vacuum pump and the other end connected to the sealed space S. When the chuck top 20 is raised by the aligner 21 and the contact probes 18a of the probe card 18 attached to the bottom surface of the pogo frame 23 become close to or in contact with the electrodes of the devices formed on the wafer W attracted and held on the chuck top 20, the sealed space S is formed by the bellows 32. At this time, the sealed space S is depressurized by the vacuum suction of the second vacuum mechanism 35, and the chuck top 20 is attracted to the pogo frame 23 such that the contact probes 18a are brought into contact with the electrodes in an overdriven state. In this state, an electrical signal is transmitted from the tester 50 to the devices formed on the wafer W via the contact probes 18a of the probe card 18, thereby carrying out an inspection for the electrical characteristics (conduction states or the like) of the devices.

When the chuck top 20 is attracted to the pogo frame 23, the aligner 21 is retracted downward and moved in the X direction and used for transferring a wafer W to and from a chuck top 20 of another inspection device 30 on the same stage.

A plurality of mechanical stoppers 36 is disposed in an outer peripheral region of the upper support member 32a of the pogo frame 23. In this example, five mechanical stoppers 36 are provided as shown in FIG. 4. However, the number of the mechanical stoppers 36 is not limited to five, and may be three or more. In FIG. 4, the contact probes 18a are illustrated as a probe group corresponding to each unit device formed on the wafer W.

Each of the mechanical stoppers 36 has a rod 37 that can be moved vertically in an unlocked state, and a lock mechanism 38 for locking the rod 37 to prevent upward movement of the rod 37 by supplying air. The lower ends of the rods 37 are in contact with the upper surface of the lower support member 32b of the bellows 32. The lower support member 32b may be reduced in size to make direct contact between the lower ends of the rods 37 and the chuck top.

When the mechanical stoppers 36 are unlocked, the rods are movable vertically by the vertical movement of the chuck top 20. However, when the chuck top 20 reaches a height at which predetermined contact is made between the wafer W and the contact probes 18a, preferably after the depressurization of the sealed space S is started, air is supplied to the lock mechanisms 38 and the lock mechanisms 38 lock the rods 37 to prevent the upward movement of the rods 37. The expression "the predetermined contact is made between the wafer W and the contact probes 18a" preferably indicates a state in which the contact probes 18a are overdriven by a predetermined amount after the wafer W and the contact probes 18a are in contact with each other.

When the mechanical stoppers 36 are locked as described above, the mechanical stoppers 36 restrict the vertical inclination of the chuck top 20 and maintain the parallel state of the chuck top 20 even when a moment is generated on the chuck top 20 due to the offset of the center of gravity (the position where the resultant force of the reaction forces from the contact probes 18 is generated) of the contact probes 18a at the time of making predetermined contact between the contact probes 18a and the wafer W on which multiple devices are formed offset. In other words, the mechanical stoppers 36 serve as an inclination restriction mechanism for restricting the inclination of the chuck top 20. When the control unit 42 recognizes that the moving distance of the elevating member 21a of the aligner 21 has reached a predetermined value, an air supply command is issued. Based on the command, air is supplied to the lock mechanisms 38, and the rods 37 are locked.

<Operation of the Inspection Device>

Next, an example of the operation of the inspection device 30 configured as described above will be described based on the flowchart of FIG. 5.

Figure 6:
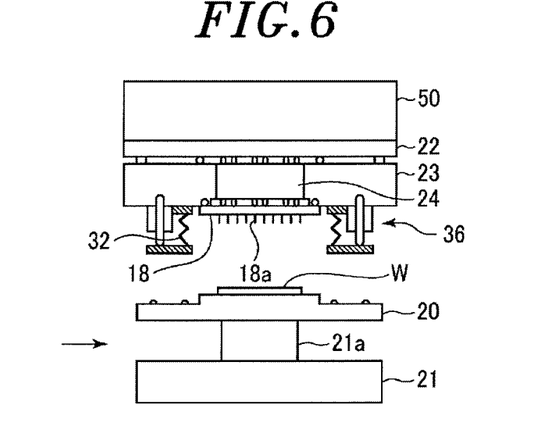
FIG. 6 schematically shows a state of the inspection device in step 1.

First, the wafer W is transferred to the chuck top 20 by the transfer robot 19 below the probe card 18, and the aligner 21 moves the chuck top 20 so that the wafer W mounted on the chuck top 20 can face the probe card 18 as shown in FIG. 6 (step 1).

Figure 7:
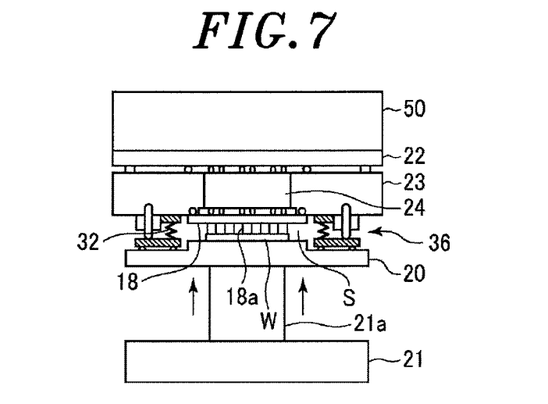
FIG. 7 schematically shows a state of the inspection device in step 3.

Thereafter, the chuck top 20 is raised by the elevating member 21a of the aligner 21 (step 2). Then, when the wafer W is close to or in contact with the contact probes 18a of the probe card 18, the upward movement of the chuck top 20 by the elevating member 21a of the aligner 21 is stopped, and the seal members 33 and the lower support member 32b of the bellows 32 are brought into close contact with each other to form a sealed space S as shown in FIG. 7 (step 3). Further, the chuck top 20 is raised by the elevating member 21a of the aligner 21 to a position where the predetermined contact is made between the wafer W and the contact probes 18a, preferably an overdrive position where the contact probes 18a are overdriven by a predetermined amount (step 4). Then, the sealed space S is depressurized (step 5). The pressure in the sealed space S at this time is maintained at a value (calculated value) at which the overdrive can be maintained.

Thereafter, air is supplied to the lock mechanisms 38 of the mechanical stoppers 36 and the rods 37 are locked, thereby restricting the upward movement of the rods 37 (step 6).

Figure 8:
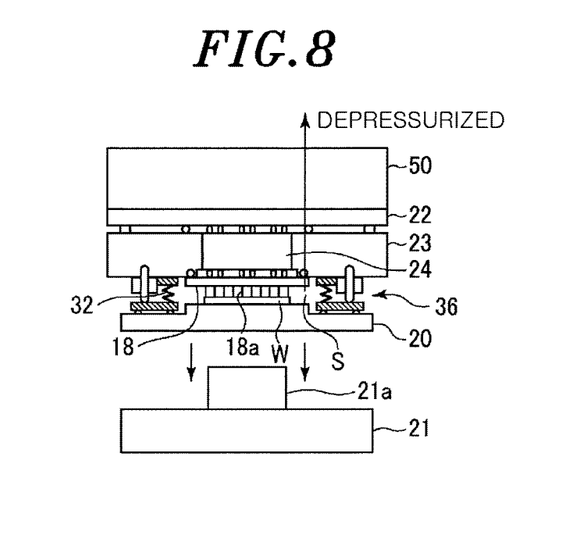
FIG. 8 schematically shows a state of the inspection device in step 9.

Then, the sealed space S is further depressurized to a level at which the chuck top 20 can be held (step 7). Next, the elevating member 21a of the aligner 21 is stopped (step 8). Thereafter, the elevating member 21a is lowered as shown in FIG. 8 (step 9).

At this time, since the sealed space S is depressurized to the level at which the chuck top 20 can be held, the state in which the chuck top 20 is attracted to the pogo frame 23 is maintained. The electrical characteristics (conduction states or the like) of the devices are inspected by transmitting electrical signals from the tester 50 to the devices formed on the wafer W via the contact probes 18a of the probe card 18.

In this state, the aligner 21 becomes available and is moved to another inspection device 30 on the same stage to transfer a wafer. When an inspection of the electrical characteristics is performed by one inspection device 30, the aligner 21 can transfer wafer W in other inspection devices 30. Therefore, a plurality of inspection devices 30 can efficiently inspect wafers W using one aligner 21.

Figure 9:
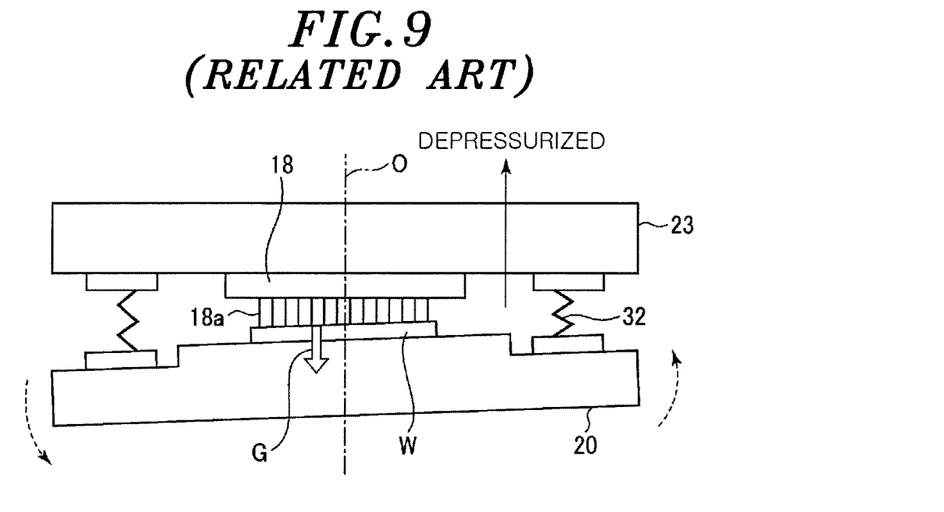
FIG. 9 explains a mechanism in which a chuck top is inclined in a conventional inspection device.

When the devices formed on the wafer W are offset from the center of the wafer W, the center of gravity of the contact probes 18a, i.e., the resultant force of the reactant forces from the contact probes 18a, is applied to the position offset from the center O of the chuck top 20 and the probe card 18 and, thus, a moment is generated on the chuck top 20, as shown in FIG. 9. If the elevating member 21a of the aligner 21 is lowered in this state, the chuck top 20 is vertically inclined by the moment in the conventional case. Accordingly, parallism between the wafer and the probe card deteriorates, and excessive overdrive is produced partly on the contact probes 18a.

Figure 10:
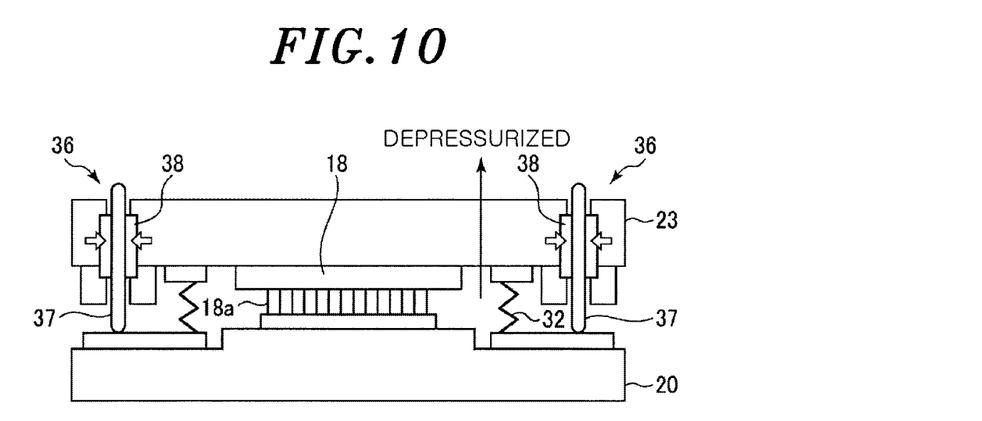
FIG. 10 shows a mechanism in which the inclination of the chuck top is restricted by a mechanical stopper.

Therefore, in the present embodiment, as described above, the chuck top 20 is raised to the overdrive position and the sealed space S is depressurized. Then, the lock mechanisms 38 of the mechanical stoppers 36 are switched on to lock the rods 37 whose tip ends have been in contact with the lower support member 32b on the upper surface of the chuck top 20, thereby preventing the upward movement of the rods 37. Accordingly, as shown in FIG. 10, even if the elevating member 21a of the aligner 21 is lowered and a moment is generated on the chuck top 20, the chuck top 20 is locked by the rods 37 of the mechanical stoppers 36, and the vertical inclination of the chuck top is restricted. As a result, parallism between the wafer and the probe card can be maintained satisfactorily.

As a result, excessive overdrive of the contact probes 18a is suppressed, and the reduction of the lifetime of the contact probes 18a is prevented. As a result, the undesirable contact between the contact probes 18a and the electrodes of the devices is prevented, and the inspection can be properly performed.

The mechanical stoppers 36 may be locked before the sealed space S is depressurized. However, it is preferable to lock the mechanical stoppers 36 after the sealed space S is depressurized because the positional relationship between the probe card 18 and the chuck top 20 may be changed when the sealed space S is depressurized.

Second Embodiment of the Inspection Device

Next, a second embodiment of the inspection device will be described.

Figure 11:
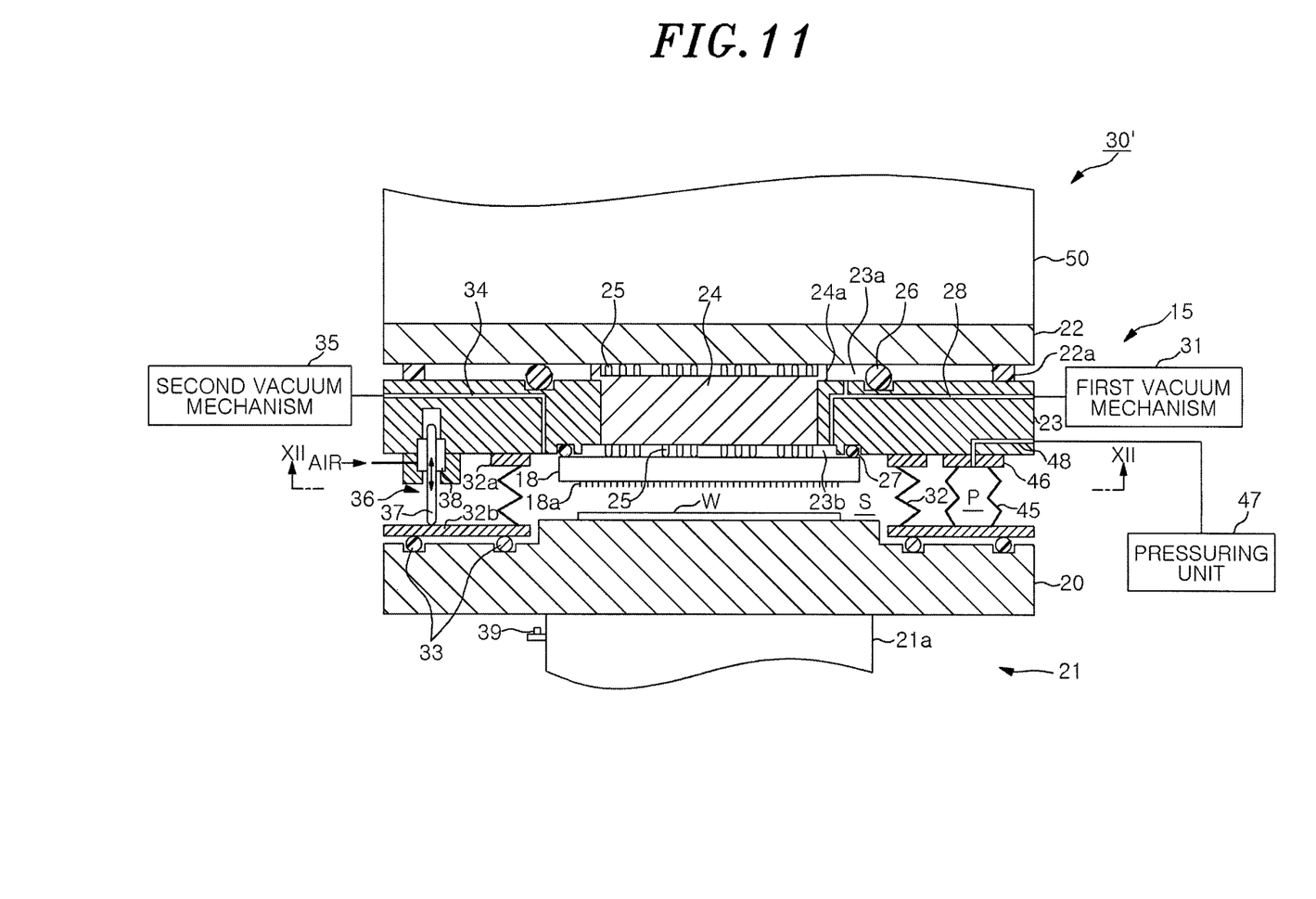
FIG. 11 is a cross-sectional view of an inspection device according to a second embodiment.
Figure 12:
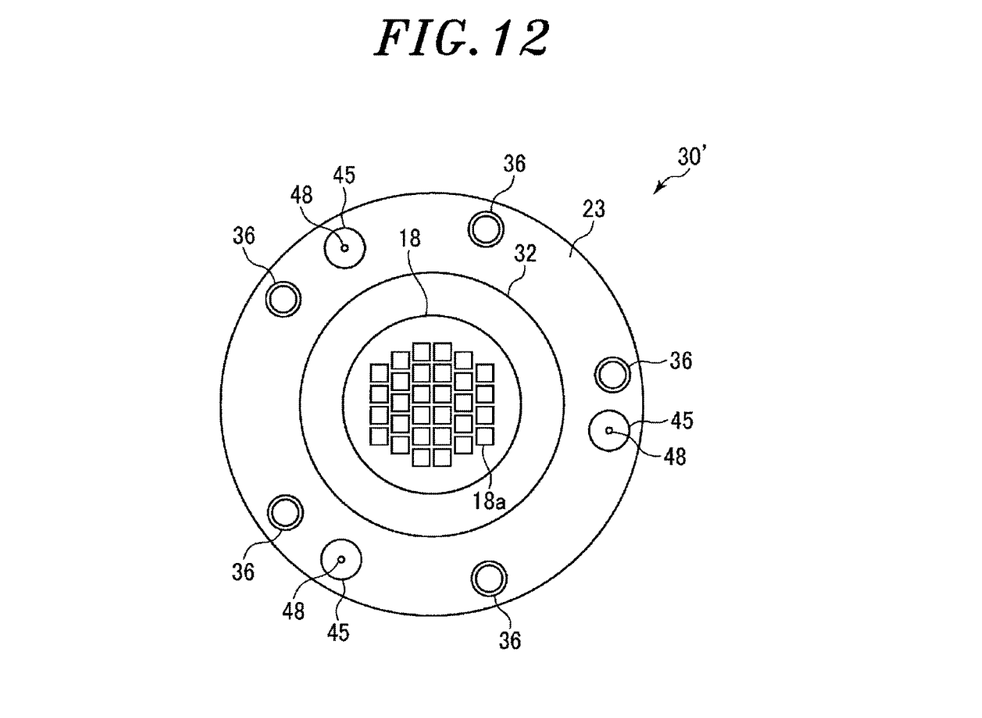
FIG. 12 is a cross-sectional view taken along a line XII-XII in FIG. 11.

FIG. 11 is a cross-sectional view showing an inspection device according to the second embodiment. FIG. 12 is a cross-sectional view taken along a line XII-XII in FIG. 11.

An inspection device 30' of the present embodiment is the same as the inspection device 30 of the first embodiment except in that it further includes a plurality of auxiliary bellows 45, a pressuring unit 47, or the like. Therefore, redundant description thereof will be omitted.

As shown in FIGS. 11 and 12, the plurality of the auxiliary bellows 45 is disposed, in addition to the plurality of the mechanical stoppers 36, around the bellows 32. Although three auxiliary bellows 45 are illustrated in this example, the number of auxiliary bellows 45 may be two or more without being limited thereto.

The auxiliary bellows 45 are extensible in the vertical direction. The upper ends of the auxiliary bellows 45 are attached to the bottom surface of the pogo frame 23 via the disc-shaped upper support member 46. A gap between the upper support member 46 and the pogo frame 23 is airtightly sealed. The lower ends of the auxiliary bellows are attached to the lower support member 32b of the bellows 32, and the inner space of the auxiliary bellows 45 becomes an airtight space P.

The pogo frame 23 has therein a gas flow path 48 having one end connected to a line extending from the pressuring unit 47 and the other end connected to the sealed space P in the auxiliary bellows 45 via the upper support member 46. The airtight space P is pressurized by supplying a gas from the pressuring unit 47 to the airtight space P through the gas flow path 48. Accordingly, the auxiliary bellows 45 apply a pressing force that presses the chuck top 20 downward via the lower support member 32b.

This pressing force can effectively work when the chuck top 20 is lowered in a state where the sealed space S surrounded by the bellows 32 is depressurized and contracted. In other words, since the sealed space S has a large volume, a long period of time is required to introduce a gas into the depressurized sealed space S and lower the chuck top 20. However, the transfer time of the inspected wafer W can be shortened by facilitating the downward movement of the chuck top 20 by pressurizing the airtight space P of the auxiliary bellows 45 and applying the pressing force to the chuck top 20. A unit for applying the pressing force is not limited to the auxiliary bellows, and may be, e.g., a spring.

<Other Applications>

The present invention is not limited to the above-described embodiments, and various modifications can be made without departing from the gist of the present invention.

Figure 13:
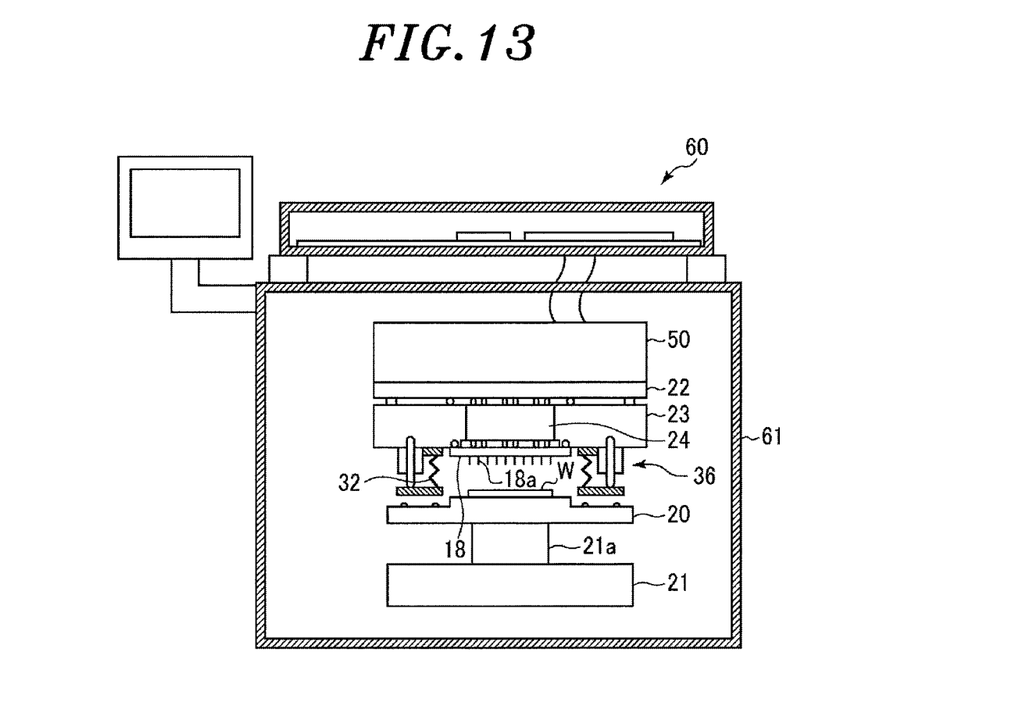
FIG. 13 is a cross-sectional view showing another example of the inspection device of the present invention.

For example, the above-described embodiments have described the case in which the present invention is applied to the inspection system including a plurality of inspection devices. However, the present invention is not limited thereto, and may be applied to a single inspection device. For example, the present invention may be applied to an inspection device 60 having a configuration in which a tester 50, a pogo frame 23, a pogo block 24, a probe card 18, a bellows 32, mechanical stoppers 36, a chuck top 20, and an aligner 21 are accommodated in a housing 61 as shown in FIG. 13.

Figure 5:
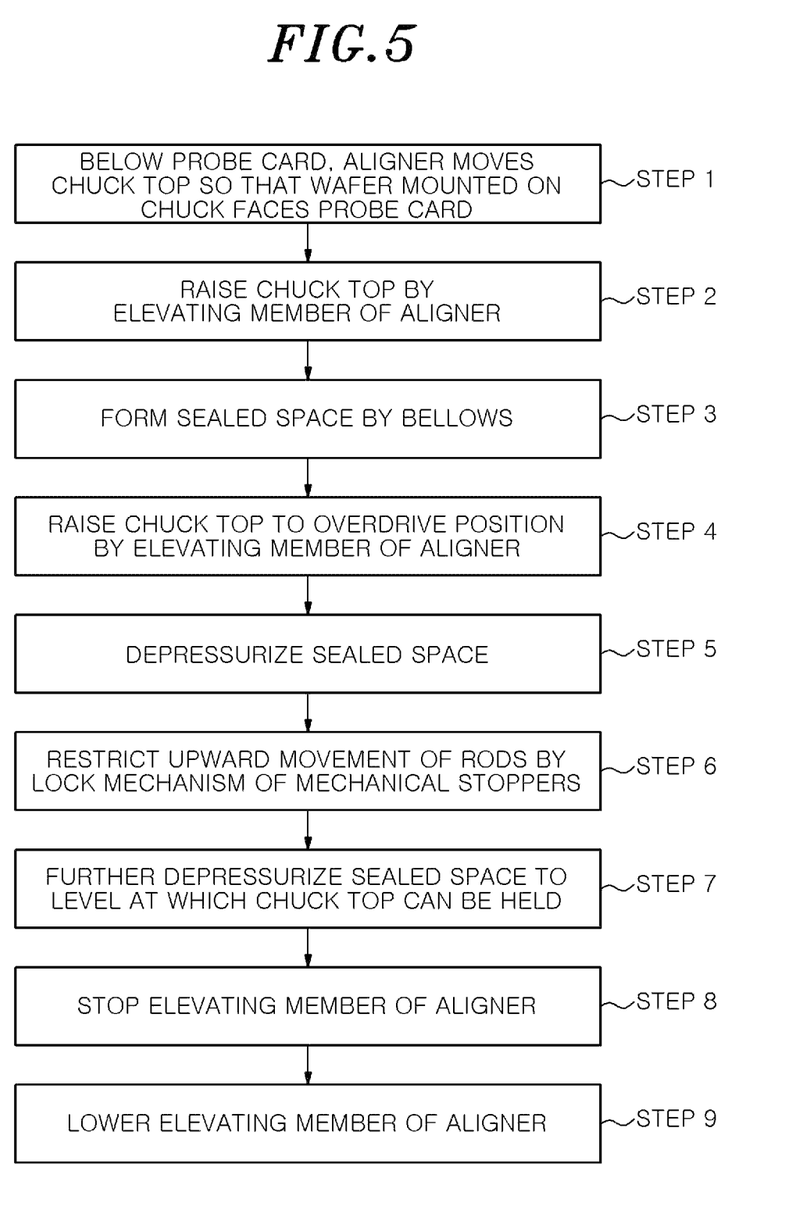
FIG. 5 is a flowchart showing an example of an operation of the inspection device according to the first embodiment.

The sequence shown in FIG. 5 is merely an example, and the timing of starting depressurization or the like may be changed.

The above-described embodiments have described the mechanical stoppers for locking the vertically movable rod as an example of the inclination restriction mechanism that restricts the vertical inclination of the chuck top when the predetermined contact is made between the contact probes of the probe card and the devices formed on the wafer. However, the present invention is not limited thereto.

DESCRIPTION OF REFERENCE NUMERALS

10: inspection system
18: probe card
18a: contact probe
20: chuck top
21: aligner
21a: elevating member
22: motherboard
23: pogo frame
24: pogo block
32: bellows
36: mechanical stopper
30, 30': inspection device
31, 35: vacuum mechanism
42: control unit
45: auxiliary bellows
47: pressuring unit
P: sealed space
S: sealed space
W: semiconductor wafer

The invention claimed is:

1. An inspection device for bringing multiple contact probes into contact with a substrate in a depressurized state to inspect electrical characteristics of devices formed on the substrate, the inspection device comprising:
 a substrate holding member configured to hold the substrate;
 a probe card disposed to face the substrate held by the substrate holding member and having the contact probes on a surface facing the substrate;
 a support member configured to support a surface of the probe card which is opposite to a surface facing the substrate;
 a bellows that surrounds the probe card and the contact probes and forms a sealed space together with the support member and the substrate holding member when the substrate is close to or in contact with the contact probes;
a gas exhaust path configured to depressurize the sealed space to form a depressurized space; and
an inclination restriction mechanism disposed between the support member and the substrate holding member and configured to restrict vertical inclination of the substrate holding member when a predetermined contact is made between the substrate and the contact probes,
wherein the inclination restriction mechanism includes mechanical stoppers disposed around the bellows and configured to restrict the vertical inclination of the substrate holding member.

2. The inspection device of claim 1, wherein each of the mechanical stoppers has a rod that is vertically movable by vertical movement of the substrate holding member and a lock mechanism configured to lock upward movement of the rod when predetermined contact is made between the substrate and the contact probes, and
the mechanical stoppers include three or more mechanical stoppers disposed around the bellows.

3. The inspection device of claim 1, wherein after the substrate is held by the substrate holding member, the substrate holding member is raised to form the sealed space.

4. The inspection device of claim 1, further comprising:
a pressing force application unit disposed around the bellows and configured to apply a pressing force that presses the substrate holding member downward.

5. The inspection device of claim 4, wherein the pressing force application unit has multiple auxiliary bellows which have airtight spaces therein and are disposed around the bellows, and applies the pressing force that presses the substrate holding member downward by pressurizing the airtight spaces by a gas supplied into the airtight spaces.

6. A contact method for bringing multiple contact probes into contact with a substrate in a depressurized state using an inspection device including a substrate holding member configured to hold the substrate, and a probe card having the contact probes on a surface facing the substrate, the contact method comprising:
transferring the substrate to the substrate holding member below the probe card and adjusting a position of the substrate holding member using an aligner such that the substrate is disposed to face the probe card;
raising the substrate holding member using the aligner to a position where the substrate is close to or in contact with the contact probes and forming a sealed space in a region including the probe card, the contact probes, and the substrate using a bellows;
raising the substrate holding member using the aligner to a position where predetermined contact is made between the substrate and the contact probes in a state where the sealed space is formed;
depressurizing the sealed space;
restricting inclination of the substrate holding member using an inclination restriction mechanism; and
retracting the aligner from the substrate holding member,
wherein the inclination restriction mechanism includes mechanical stoppers disposed around the bellows and configured to restrict vertical inclination of the substrate holding member.

7. The contact method of claim 6, wherein each of the mechanical stoppers has a rod that is vertically movable by vertical movement of the substrate hold member and a lock mechanism configured to lock upward movement of the rod when predetermined contact is made between the contact probes and electrodes of devices formed on the substrate,
the mechanical stoppers include three or more mechanical stoppers disposed around the bellows, and
the rod is raised in an unlocked state by the substrate holding member before said restricting the inclination, and upward movement of the rod is locked by the lock mechanism during said restricting the inclination.

8. The contact method of claim 6, wherein said restricting the inclination is performed after said depressurizing the sealed space.

9. The contact method of claim 6, further comprising, after said restricting the inclination:
adjusting a pressure in the sealed space to a level at which the substrate holding member is held.

10. The contact method of claim 6, wherein the position where the predetermined contact is made between the substrate and the contact probes is a position where the contact probes are overdriven by a predetermined amount after the substrate and the contact probes are in contact with each other.

11. The contact method of claim 6, wherein when the predetermined contact is made between the substrate and the contact probes and the substrate holding member is lowered, a pressing force that presses the substrate holding member downward is applied by a pressing force application unit.

12. The contact method of claim 11, wherein the pressing force application unit has multiple auxiliary bellows which have airtight spaces therein and are disposed around the bellows, and applies the pressing force that presses the substrate holding member downward by pressurizing the airtight space by a gas supplied into the airtight space.

13. The inspection device of claim 1, further comprising:
a pressing force application unit disposed around the bellows and configured to apply a pressing force that presses the substrate holding member downward.

14. The inspection device of claim 2, further comprising:
a pressing force application unit disposed around the bellows and configured to apply a pressing force that presses the substrate holding member downward.

15. The inspection device of claim 13, wherein the pressing force application unit has multiple auxiliary bellows which have airtight spaces therein and are disposed around the bellows, and applies the pressing force that presses the substrate holding member downward by pressurizing the airtight spaces by a gas supplied into the airtight spaces.

16. The contact method of claim 6, wherein said restricting the inclination is performed after said depressurizing the sealed space.

17. The contact method of claim 6, further comprising, after said restricting the inclination:
adjusting a pressure in the sealed space to a level at which the substrate holding member is held.

18. The contact method of claim 6, wherein the position where the predetermined contact is made between the substrate and the contact probes is a position where the contact probes are overdriven by a predetermined amount after the substrate and the contact probes are in contact with each other.

* * * * *